(12) United States Patent
Fert et al.

(10) Patent No.: US 6,291,993 B1
(45) Date of Patent: Sep. 18, 2001

(54) MAGNETIC FIELD SENSOR AND METHOD FOR MAKING SAME

(75) Inventors: Albert Fert, Paris; Frédéric Petroff, Taverny; Luiz Fernando Schelp, Paris; Alain Schuhl, Palaiseau, all of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/341,694
(22) PCT Filed: Nov. 24, 1998
(86) PCT No.: PCT/FR98/02514
§ 371 Date: Jul. 26, 1999
§ 102(e) Date: Jul. 26, 1999
(87) PCT Pub. No.: WO99/27379
PCT Pub. Date: Jun. 3, 1999

(30) Foreign Application Priority Data

Nov. 25, 1997 (FR) .................................................. 97 14764

(51) Int. Cl.⁷ .................................................. G01R 33/02
(52) U.S. Cl. ........................ 324/252; 338/32 R; 428/332
(58) Field of Search .............................. 324/252, 207.21; 338/32 R; 360/320, 313; 428/209, 692, 212, 332

(56) References Cited

U.S. PATENT DOCUMENTS

| | | | |
|---|---|---|---|
| 5,313,186 | 5/1994 | Schuhl et al. | 338/32 R |
| 5,474,833 * | 12/1995 | Etienne et al. | 428/209 |
| 5,521,500 | 5/1996 | Schuhl et al. | 324/249 |
| 5,617,071 * | 4/1997 | Daughton | 338/32 R |
| 5,644,455 * | 7/1997 | Schultz | 360/320 |
| 5,661,449 * | 8/1997 | Araki et al. | 338/32 R |
| 5,686,879 | 11/1997 | Schuhl et al. | 338/32 R |
| 5,738,929 * | 4/1998 | Maeda et al. | 421/141 |

* cited by examiner

Primary Examiner—Christine Oda
Assistant Examiner—Subhash Zaveri
(74) Attorney, Agent, or Firm—Oblon, Spivak, McClelland, Maier, & Neustadt, P.C.

(57) ABSTRACT

A magnetic sensor having a layer of nonmagnetic insulator including at least one layer of ferromagnetic particles. This combination of layers is sandwiched between two ferromagnetic electrodes. Electrons are transported by the tunneling effect between each electrode and the ferromagnetic particles. The tunneling resistance depends on the orientation of the magnetization of the electrodes and therefore varies in the presence of the magnetic field. The multichannel and multistage nature of the tunneling conduction eliminates the problems of short-circuiting by porosity, thus leading to less difficult fabrication and improved robustness in terms of breakdown. The possible thermal fluctuations of the magnetic moments of the aggregates can be suppressed by the choice of a magnetic material for the part of the insulating layer which contains the aggregates.

20 Claims, 2 Drawing Sheets

MAGNETIC FIELD SENSOR AND METHOD FOR MAKING SAME

BACKGROUND OF THE INVENTION

The invention relates to a magnetic field sensor and to a process for fabricating such a sensor.

Such a sensor may be employed for reading magnetic recordings such as magnetic tapes or magnetic disks or for producing magnetic memory with integrated reading (Magnetic Random Access Memory) and in general for the detection of weak magnetic fields with high spatial and angular resolution.

DISCUSSION OF THE INVENTION

It is known that the resistance of a tunnelling junction composed of a very thin layer of insulator between two ferromagnetic metal electrodes depends on the relative orientation of the magnetization in the two electrodes. This effect was discovered by Jullière in 1975 (see document [1] at the end of the description), but it is only recently that high (up to 30%) and fairly reproducible magnetoresistance values have been obtained (see, for example, document [2] at the end of the description). We will refer to this type of junction as a "planar junction". Typically, in the planar junctions studied by Moodera et al. [2], a 1.5 to 2.5 mm layer of insulator (for example $Al_2O_3$) separates two electrodes of cobalt or cobalt alloy. Deposition through masks makes it possible to produce the conventional crossed junction geometry in which the crossover of the two electrodes separated by the insulating layer defines the tunnelling effect zone. Compared with magnetic multilayers with giant magnetoresistance (see document [5]), tunnelling junctions have the advantage of much higher resistance, which is beneficial for a number of applications. Their drawback is the difficulty of fabricating them: roughness, porosity ("pinhole") and other imperfections of the ultra-thin insulating layer establish direct contacts between electrodes which short-circuit the junction, and it is generally difficult to obtain reproducible results. The very small thickness of the insulating layers also makes planar junctions sensitive to breakdown effects.

A magnetoresistance effect resulting from a tunnelling effect between ferromagnetic metals may also be obtained in granular materials consisting of small particles (aggregates) of ferromagnetic metal which are enclosed in an insulating matrix (see documents [3] and [4]). Conduction takes place by tunnelling transport of electrons from one aggregate to the neighbouring aggregate, and the resistance of the material varies when a magnetic field modifies the relative orientation of the magnetic moments of the aggregates. These materials are easier to fabricate than planar junctions, are robust and can exhibit significant variations in resistance [3 and 4]. However, their disadvantage derives from the high field needed for orienting the moments of small particles and obtaining the magnetoresistance effect. This field is particularly high in the superparamagnetic range, that is to say when the temperature is above the barrier temperature ($T_B$) for the thermal fluctuations of the moments.

SUMMARY OF THE INVENTION

The invention relates to a junction which combines the properties of planar junctions (weak field response) and those of granular material (ease of production and robustness).

The invention therefore relates to a magnetic sensor comprising two conductive layers, at least one of which is a ferromagnetic material, these two layers being separated by a layer of a nonmagnetic insulating material which has an almost uniform thickness and contains particles of ferromagnetic material that lie in a plane parallel to the layer of ferromagnetic material, the magnetization characteristics of the ferromagnetic conductive layer and of the ferromagnetic particles being different.

The invention also relates to a process for producing a sensor, characterized in that it comprises the following steps:
producing the ferromagnetic conductive layer on one face of a substrate:
producing a first layer of nonmagnetic insulator;
producing, by sputtering, a thin layer of a ferromagnetic conducting material so that the said material aggregates to form aggregate particles;
producing a second layer of nonmagnetic insulator;
producing the layer of a ferromagnetic conducting material.

BRIEF DESCRIPTION OF THE DRAWINGS

The various subjects and characteristics of the invention will become more clearly apparent in the following description and in the appended figures, in which.

DETAILED DESCRIPTION OF THE PREFERRED EMBODIMENT

Figure 1A:
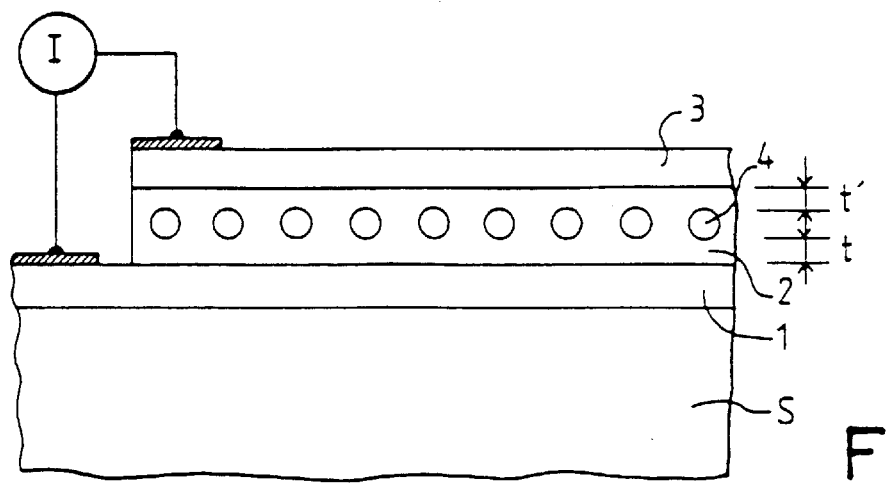
FIGS. 1a to 1c represent a simplified illustrative embodiment of the sensor of the invention.
Figure 1B:
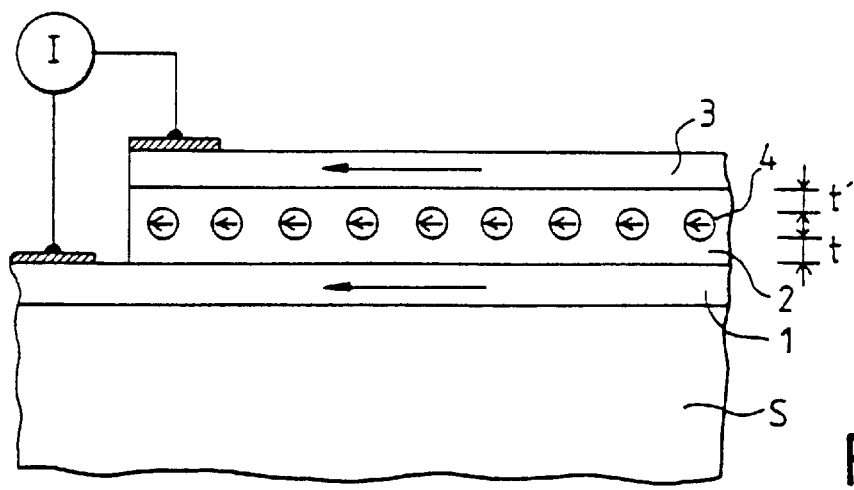
Figure 1C:
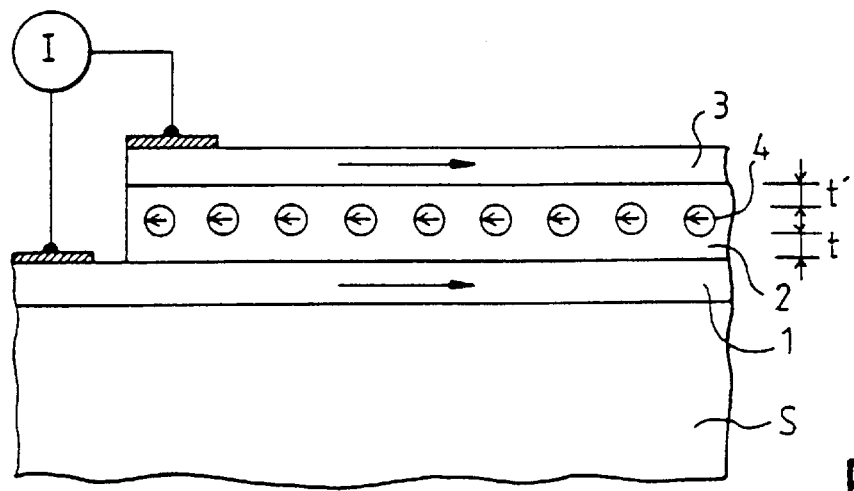

Referring to FIGS. 1a to 1c, an illustrative embodiment of a sensor according to the invention will be described first. This sensor comprises, on a substrate S, a stack of an electrode 1, a layer of insulator 2 and another electrode 2. The layer of insulator 2 contains particles of a ferromagnetic conducting material. All these particles lie substantially in a same plane parallel to the planes of the electrodes. At least one of the electrodes is made of ferromagnetic conducting material. In the following description, it will be assumed that the two electrodes are made of a ferromagnetic conducting material.

By connecting a current generator I to the electrodes 1 and 3, the flow of a current by the tunnelling effect will be obtained between the electrode 3 and each of the particles and between each of the particles and the electrode 1.

FIG. 1b represents the case in which the magnetization directions in the ferromagnetic particles 4 and in the electrodes 1 and 3 are parallel. In this case, the resistance of the structure is a minimum and a maximum current is measured.

Conversely, in FIG. 1c, the magnetizations of the particles and of the electrodes are anti-parallel. The resistance of the structure is a maximum and the measured current will be a minimum.

By way of example for particles made of material of the cobalt type, cobalt electrodes and particles lying at t'=1.5 nm from the electrode 3 and t=2.7 nm from the electrode 1, the magnetic field for reversing the magnetization of the electrodes which produces the variation in resistance was measured at about 90 oersteds.

Figure 2:
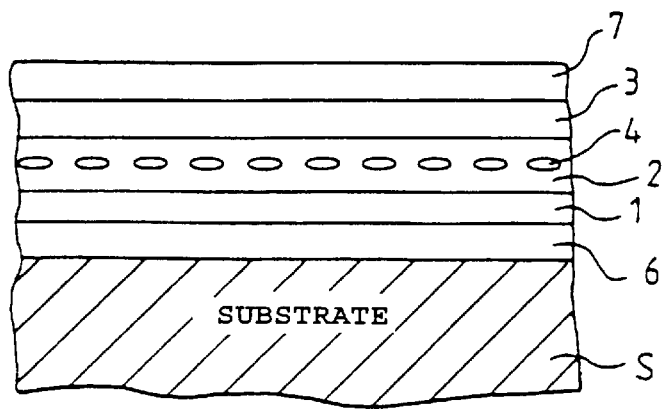
FIG. 2 represents a more complete illustrative embodiment of the sensor of the invention.

Referring to FIG. 2, a more detailed illustrative embodiment of the sensor of the invention will now be described.

It comprises, on the substrate S, a buffer layer 6, a ferromagnetic conductive electrode layer 1, a layer of insulator 2 comprising ferromagnetic particles, a ferromagnetic conductive electrode layer 3 and a protective layer 7.

The conductive electrode layer 1 is made of soft magnetic material such as Permalloy. Its thickness is not critical and may lie between 10 nm and 1 μm.

The layer of insulator 2 is made of $Al_2O_3$. The particles 4 are made of cobalt, of FeNi or of CoFe. The size of the particles lies between 2 and 4 nm. The thickness of the layer of insulator 2 is such that the outer edges of the particles are at a distance of between 1.5 and 3 nm away from the electrodes 1 and 3. The electrode layer 3 is similar to the layer 1. The protective layer may be made of a metal such as gold.

Figure 3:
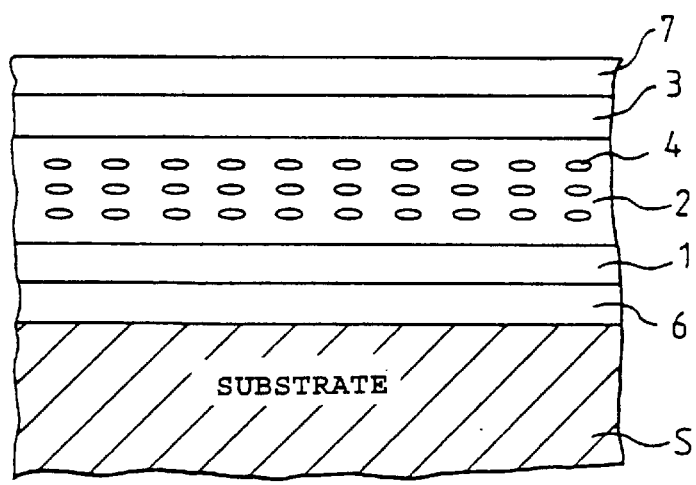
FIG. 3 represents a sensor comprising a plurality of layers of ferromagnetic particles.

The illustrative embodiment in FIG. 3 comprises, in the layer of insulator 2, a plurality of planes of ferromagnetic particles 4. In FIG. 3, three planes of particles have been represented.

A process for producing a sensor according to the invention will now be described.

On one face of a substrate 1, an electrode layer 1 is produced, a layer of insulating material is produced, preferably for example by sputtering the insulator, or alternatively by depositing a metal in an oxidizing atmosphere in order to obtain an insulating oxide, or alternatively by depositing a metal and oxidation then, preferably by sputtering, using the same process an ultra-thin layer of ferromagnetic material (metal, alloy or oxide such as $Fe_3O_4$) is produced.

In fact, because of the small thickness of this layer, the material will have a tendency to form aggregates so as to provide a uniform distribution of particles. The amount of material deposited makes it possible to control the size and the concentration of the aggregates. Next, a new layer of insulator is deposited then an electrode layer 3 is deposited. This provides the structure in FIG. 1.

In order to produce a structure comprising a plurality of layers of particles, as is represented in FIG. 3, layers of insulator and ultra-thin layers of ferromagnetic material are deposited alternately. The amount of insulator deposited makes it possible to fix the average thickness t of insulator between layers of particles. This thickness as well as the average thicknesses of insulator between the electrodes (1 and 3) and layers of particles lies substantially between 1.5 nm and a few nm. Realistically, the number of layers of particles may be up to about 10.

The trilayers or multilayers described above may be deposited through masks in order to produce, for example, the conventional crossed junction structure (as in reference [2]). Other types of geometry for the current feeds and the voltage contacts may also be produced, either by structuring the multilayer deposited by methods of lithography and etching, or by using a junction technology of the ramp type.

The electrical conduction between electrodes 1 and 3, in the type of junction described above, is by tunnelling effect from electrode 1 to particle then from particle to particle if the number of layers of particles is more than 1, and finally from particle to electrode 3. The multichannel and multistep nature in each channel for the tunnelling conduction makes it possible to avoid a possible short-circuit by porosity ("pinhole") which is frequent in planar junctions. By way of explanation, in a planar junction composed of 2 electrodes separated by an ultra-thin insulating layer, a very small number of contacts between electrodes through the pinhole effect short-circuits the tunnelling resistance. The need to avoid any pinhole in the insulating layer of a thickness of a few nanometres then makes the planar junction preparation extremely difficult. Conversely, in the structure according to the invention, a short-circuit is unlikely because it could only occur through successive pinholes on all the tunnelling steps of a given channel. This leads to fabrication which is less difficult than that of known planar junctions, as well as a high degree of robustness with respect to breakdown effects.

The magnetic field-dependence of the tunnelling resistance of the proposed structure is linked with the relative orientation of the magnetizations at the input and the output of each tunnelling step. However, by exploiting the very rapid increase in the tunnelling resistance with the thickness of insulator, the thicknesses of insulators separating the electrodes 1 and 3 from the layers of particles may be fixed slightly higher than t, so that the total resistance of the junction is essentially controlled by the tunnelling resistances between electrodes and particles, and therefore controlled by the relative orientation of the magnetization in the electrodes and the aggregates. Planar electrodes and aggregates have very different coercive forces. In weak field scanning, the magnetization of the electrodes varies very rapidly, whereas the magnetization of the aggregates will keep its so-called residual value (induced by an initial polarization). The variation in the tunnelling resistance will therefore follow the variation in the magnetization of the electrodes, as in a planar junction.

A choice for the electrodes of a very soft magnetic material, Permalloy or monocrystalline material, for example, should make it possible to obtain the desired magnetoresistance effects in a few gauss. For the aggregates (particles) cobalt, CoFe, FeNi, etc. are then for example chosen. The weak field sensitivity performance of the planar junctions is then found, while retaining the ease of processing and the robustness of granular materials.

Figure 4:
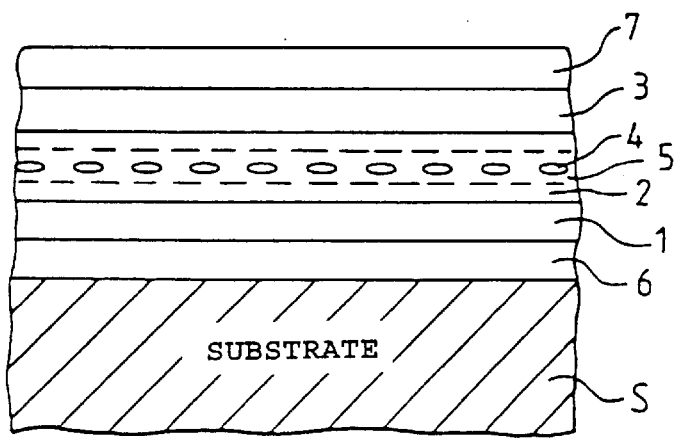
FIG. 4 represents an alternative embodiment of the sensor of the invention.

One condition is, however, necessary: the existence of a non-zero residual magnetization in the aggregates, that is to say a barrier temperature $T_B$ for fluctuations (which was introduced above) above the operating temperature. The temperature $T_B$ is linked with the size of the aggregates and their interactivities. In order to obtain a sufficiently high value $T_B$ (for example $T_B \geq 300°$ K, it is possible:

- either to increase the size of the particles by the deposition conditions. In this case, particles with sizes of between 4 and 10 nm will be provided;
- or to increase the interactions between moments of particles in a layer by increasing their density (depositing a larger amount of metal);
- or to use a ferromagnetic or anti-ferromagnetic or ferrimagnetic insulator (ferrite for example) whose interaction with the aggregates will increase $T_B$. The material deposited in the part of the insulating layer containing the aggregates will therefore be a magnetic insulator; conversely, a nonmagnetic insulator will have to remain between aggregates and electrodes in order to decouple them magnetically. Such a structure is represented in FIG. 4. In this structure, the insulating layer 2 contains a magnetic (ferromagnetic, anti-ferromagnetic or ferrimagnetic) insulating layer 5 which contains the particles 4 (its thickness needs to be very slightly greater than the vertical dimension of the particles).

Finally, another advantage of the proposed structure in comparison with planar junctions derives from the possibility of using Coulomb barrier effects [6]. The effects linked with the charging energy of small aggregates can increase the tunnelling resistance by a significant factor. For nanometre particles, this increase is still significant at room temperature. This increase in resistance due to the Coulomb barrier may be advantageous for obtaining high resistances and therefore strong magnetoresistive signals.

In general, the sensor according to the invention uses the transport of electrons by the tunnelling effect between two electrodes of ferromagnetic material through an insulating thin layer containing particles of ferromagnetic material (aggregates). The tunnelling resistance depends on the orientation of the magnetization of the electrodes, and therefore varies in the presence of a magnetic field. In comparison with junctions of the conventional type (without aggregates), the multichannel and multistage nature of the tunnelling conduction eliminates the problems of short-circuiting by porosity, thus leading to less difficult fabrication and improved robustness in terms of breakdown. The possible thermal fluctuations of the magnetic moments of the aggregates can be suppressed by the choice of a magnetic material for the part of the insulating layer which contains the aggregates.

References

[1] M. Jullière, Phys. Lett. A54,225 (1975)
[2] J. S. Moodera, L. R. Kinder, T. M. Wrong, R. Meservey, Phys. Rev. Lett. 74,3273 (1995)
[3] H. Fujimori, S. Mitani, S. Ohnuma, Mat. Science and Engineering B 31,219 (1995)
[4] A. Milner et al, Phys. Rev. Lett. 1996
[5] M. N. Baibich et al, Phys. Rev. Lett. 61,2472, 1988
[6] M. F. Devoret, D. Estève, C. Urbina, Nature 360,547 (1992)

What is claimed is:

1. A magnetic sensor comprising:
    a first conductive layer and a second conductive layer, wherein at least one of the first conductive layer and the second conductive layer comprises a ferromagnetic material having a magnetization M1; and
    an insulating layer between the first conductive layer and second conductive layer, comprising a nonmagnetic insulating material of substantially uniform thickness and particles of ferromagnetic material embedded within the insulating material and lying in a plane substantially parallel to the conductive layer of ferromagnetic material,
    wherein the particles of ferromagnetic material have a magnetization M2 that is different from the magnetization M1 when the magnetic sensor is in a magnetic field.

2. A magnetic sensor according to claim 1, wherein the first conductive layer and the second conductive layer are ferromagnetic.

3. A magnetic sensor according to claim 1, wherein the first conductive layer and the second conductive layer have a soft magnetization and the ferromagnetic particles have a hard magnetization.

4. A magnetic sensor according to claim 1, wherein the nonmagnetic insulating material layer compises one of a ferromagnetic, an anti-ferromagnetic, and a ferrimagnetic insulating material covering the particles of ferromagnetic material.

5. The magnetic sensor according to claim 2, wherein dimensions of the ferromagnetic particles are between 2 and 4 manometers.

6. The magnetic sensor according to claim 4, wherein dimensions of the ferromagnetic particles are between 4 and 10 nanometers.

7. The magnetic sensor according to claim 1 or 2, wherein the ferromagnetic particles lie in several parallel planes.

8. The magnetic sensor according to claim 2, wherein at least one of the first conductive layer and the seond conductive layer is formed of Permalloy.

9. The magnetic sensor according to claim 2, wherein the ferromagnetic particles are formed of at least one of cobalt, FeNi, and CoFe and the insulating layer is formed of $Al_2O_3$.

10. The magnetic sensor according to claim 4, wherein the layer of magnetic insulating material is formed of ferrite.

11. The magnetic sensor according to claim 2 or 8, wherein a distance between a layer of ferromagnetic particles and the first conductive layer and the second conductive layer lies between 1 nanometer and 3 nanometers, and
    a distance between two layers of ferromagnetic particles is between 1 nanometer and 3 nanometers.

12. The magnetic sensor according to claim 4, wherein the thickness of the magnetic insulating layer lies between 2 and 4 nm.

13. A process for forming a magnetic sensor, comprising the steps of:
    a) forming a first ferromagnetic conductive layer on one face of a substrate;
    b) forming a first layer of nonmagnetic insulator on the first ferromagnetic conductive layer;
    c) forming a thin second layer of a ferromagnetic conducting material on the first layer of nonmagnetic insulator so that the ferromagnetic conducting material aggregates to form aggregate particles;
    d) forming a second layer of nonmagnetic insulator on the second layer of a ferromagnetic conducting material; and
    e) forming a third layer of a ferromagnetic conducting material on the second layer of nonmagnetic insulator.

14. The process according to claim 13, wherein the step (c) for forming the second thin layer of ferromagnetic conducting material, giving rise to aggregate particles, comprises sputtering the second thin layer of a ferromagnetic conducting material on the first layer of nonmagnetic insulator.

15. The process according to claim 14, further comprising the step of:
    forming an alternating sequence of layers of insulator and layers of ferromagnetic particles.

16. The process according to claim 14, further comprising the steps of:
    forming a first layer of a magnetic insulator on the first layer of insulator after forming the first layer of insulator; and
    forming a second layer of magnetic insulator on the layer of ferromagnetic conducting material and enclosing the ferromagnetic particles after forming the layer of ferromagnetic conducting material.

17. A magnetic sensor according to claim 2, wherein the first conductive layer and the second conductive layer have a soft magnetization and the ferromagnetic particles have a hard magnetization.

18. A magnetic sensor according to claim 2, wherein the nonmagnetic insulating material layer comprises one of a ferromagnetic, an anti-ferromagnetic, and a ferrimagnetic insulating material covering the particles of ferromagnetic material.

19. The magnetic sensor according to claim 3, wherein the dimensions of the ferromagnetic particles are between 2 and 4 nanometers.

20. The magnetic sensor according to claim 4, wherein the dimensions of the ferromagnetic particles are between 2 and 3 nanometers.

* * * * *